United States Patent [19]
Pritchard

[11] Patent Number: 5,734,725
[45] Date of Patent: Mar. 31, 1998

[54] TUBE EMULATOR AMPLIFIER SYSTEM

[76] Inventor: Eric K. Pritchard, Rte. 1, Box 536, Berkeley Springs, W. Va. 25411

[21] Appl. No.: 394,303

[22] Filed: Feb. 24, 1995

Related U.S. Application Data

[63] Continuation-in-part of Ser. No. 202,369, Feb. 25, 1994, Pat. No. 5,636,284, which is a continuation-in-part of Ser. No. 914,596, Jul. 20, 1992, Pat. No. 5,434,536, which is a continuation-in-part of Ser. No. 466,865, Jan. 18, 1990, Pat. No. 5,133,014, which is a continuation-in-part of PCT/US88/01025, Mar. 23, 1988, which is a continuation-in-part of Ser. No. 29,144, Mar. 23, 1987, Pat. No. 4,809,336.

[51] Int. Cl.$^6$ .................................................. H03G 3/00
[52] U.S. Cl. ......................................... 381/61; 381/123
[58] Field of Search ......................... 381/82, 86, 101, 381/102, 103, 107, 61, 28

[56] References Cited

U.S. PATENT DOCUMENTS

| | | | |
|---|---|---|---|
| 2,256,057 | 9/1941 | Roberts | 381/101 |
| 2,262,846 | 11/1941 | Herold | 381/101 |
| 2,322,558 | 6/1943 | Bachman | 381/101 |
| 2,802,061 | 8/1957 | Fine | 381/28 |
| 3,071,648 | 1/1963 | Scott | 381/28 |
| 3,806,820 | 4/1974 | Uchiyama | 381/123 |
| 4,150,253 | 4/1979 | Knoppel . | |
| 4,180,707 | 12/1979 | Moog . | |
| 4,292,467 | 9/1981 | Odlen et al. | 381/101 |
| 4,314,207 | 2/1982 | Pinternagel . | |
| 4,330,754 | 5/1982 | Hartley . | |
| 4,363,001 | 12/1982 | Suzuki et al. | 381/101 |
| 5,091,700 | 2/1992 | Smith . | |
| 5,268,527 | 12/1993 | Waller, Jr. . | |
| 5,533,136 | 7/1996 | Smith | 381/56 |

OTHER PUBLICATIONS

"Solid Tubes—A New Life for Old Designs," by Howard Sartori, in QST, Apr., 1977, pp. 45–50.
Radiotron Designer's Hardbook, 1954 (1969 printing), pp. 585, 593, 594.

*Primary Examiner*—Forester W. Isen
*Attorney, Agent, or Firm*—Barnes & Thornburg

[57] ABSTRACT

This invention is an emulation of vacuum tube guitar amplifier with devices that emulate vacuum tube plate voltage and current characteristics. This amplifier system has a switching system for selecting preamplifiers and which alters the behavior of the output stage by changing features such as feedback and compression character. The preamplifier and output stages use non-linear means for the emulation of triode amplifiers, cathode followers, phase splitters, and pentode amplifiers. The features emulated are the grid conduction with scaling and offsetting, current gain, plate voltage and current characteristics, and compression.

55 Claims, 8 Drawing Sheets

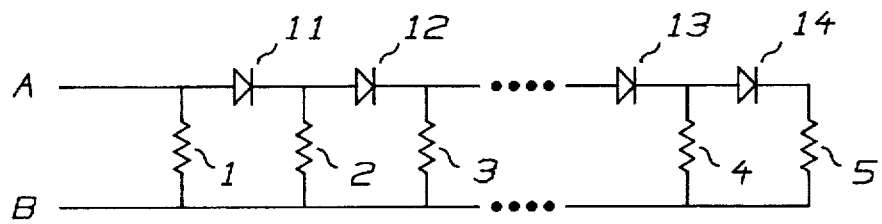
FIG 1
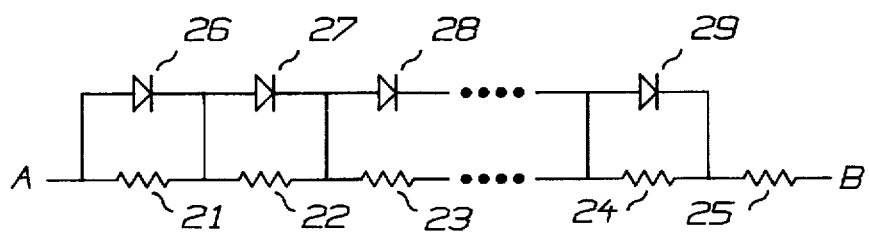
FIG 2
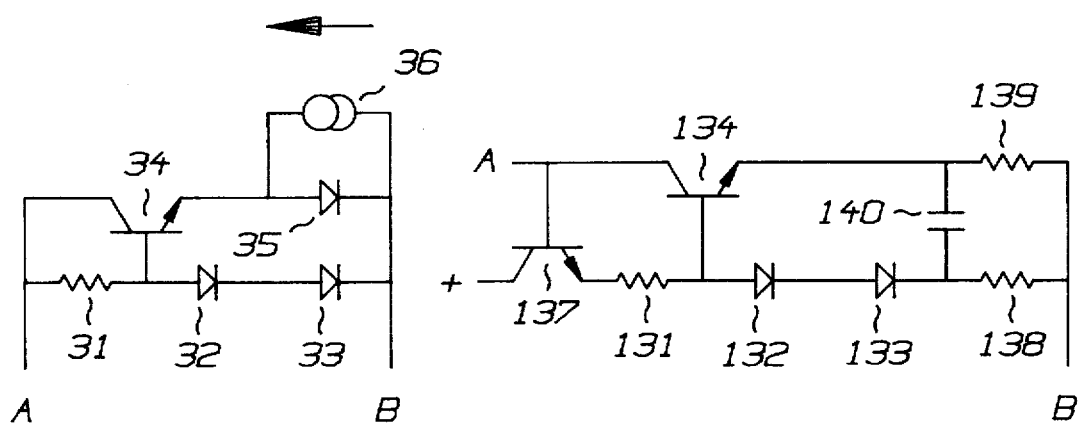
FIG 3
FIG 3A
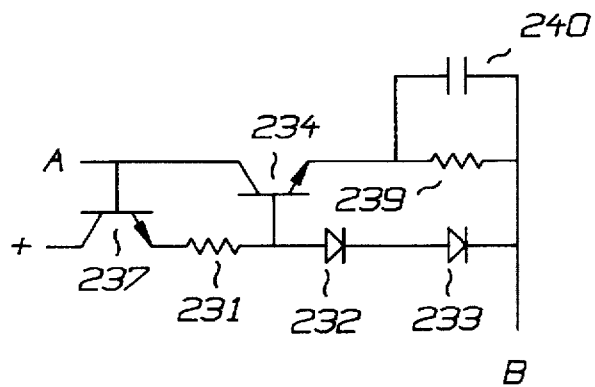
FIG 3B
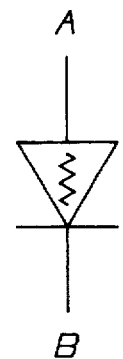
FIG 4

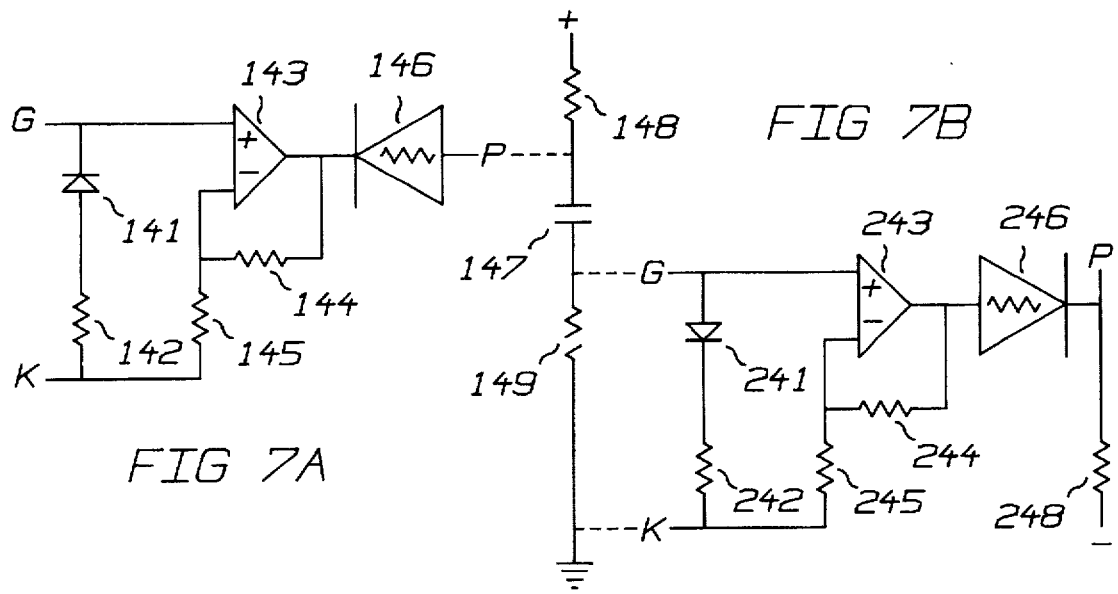
FIG 7A
FIG 7B
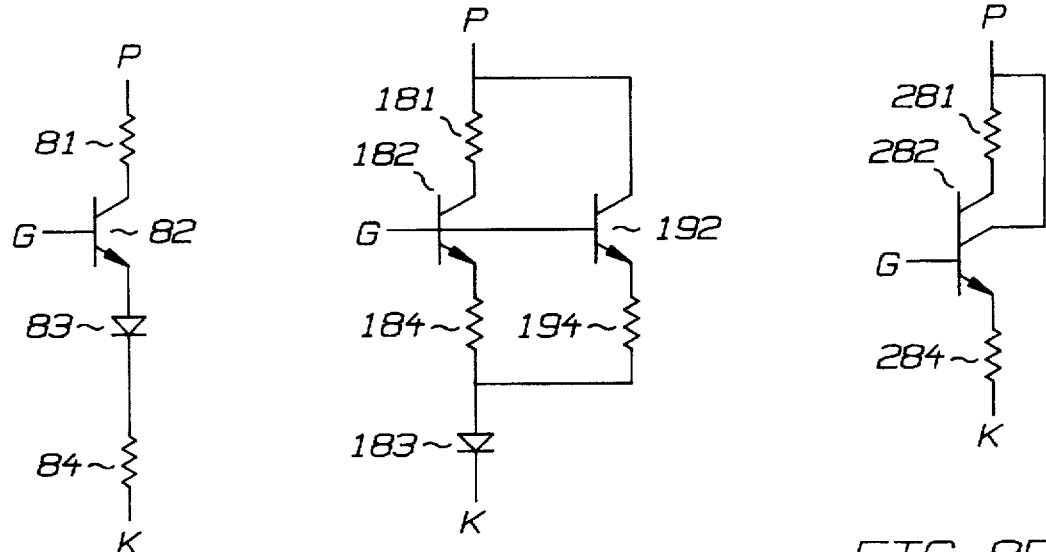
FIG 8
FIG 8A
FIG 8B
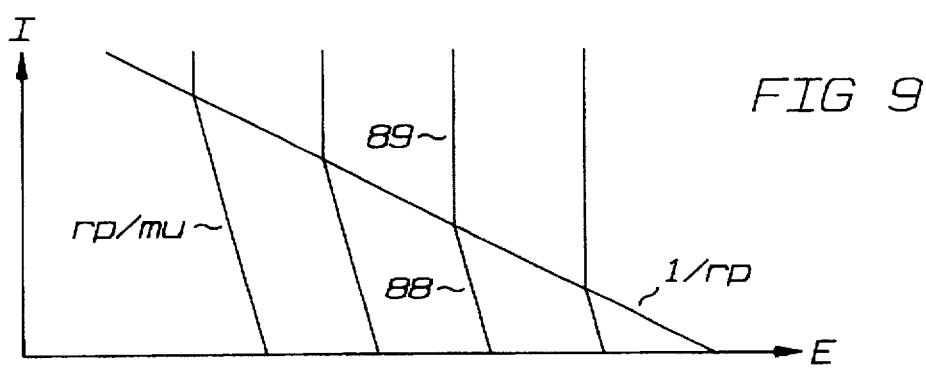
FIG 9

5,734,725

TUBE EMULATOR AMPLIFIER SYSTEM

CROSS REFERENCE

This is a continuation-in-part of U.S. application Ser. No. 08/202,369 filed Feb. 25, 1994, now U.S. Pat. No. 5,636,284, which is a continuation-in-part of U.S. application Ser. No. 07/914,596 filed Jul. 20, 1992, now U.S. Pat. No. 5,434,536, which is a continuation-in-part of U.S. application Ser. No. 07/466,865 filed Jan. 18, 1990, which is now U.S. Pat. No. 5,133,014 issued Jul. 21, 1992, which is a continuation-in-part of PCT/US88/01025 filed Mar. 23, 1988, which is now U.S. Pat. No. 4,995,084 issued Feb. 19, 1991, which is a continuation-in-part of U.S. Ser. No. 29,144 filed Mar. 23, 1987, which is now U.S. Pat. No. 4,809,336 issued Feb. 28, 1989.

BACKGROUND OF THE INVENTION

This invention relates to the emulation of vacuum tube amplifiers using the tube emulation technology. This technology emulates the operation of vacuum tube by solid state circuits. It emulates grid current, plate resistance, scaling or offsetting of grid conduction diode characteristics. This invention relates to the emulation of common cathode amplifiers, cathode followers, phase splitters, and two-terminal non-linear means.

DESCRIPTION OF THE FIGURES

FIGS. 1 and 2 are schematics of non-linear resistor-diode networks.

FIGS. 3, 3A and 3B are schematics of a non-linear diode-transistor network.

FIG. 4 is a symbol for a non-linear network.

FIGS. 7A and 7B are schematics of a low-cost triode emulator circuits.

FIGS. 8, 8A and 8B are the embodiments of a cathode follower emulator.

FIG. 9 is the graph of the output characteristics of the cathode follower.

OBJECTS OF THE INVENTION

Figure 5:
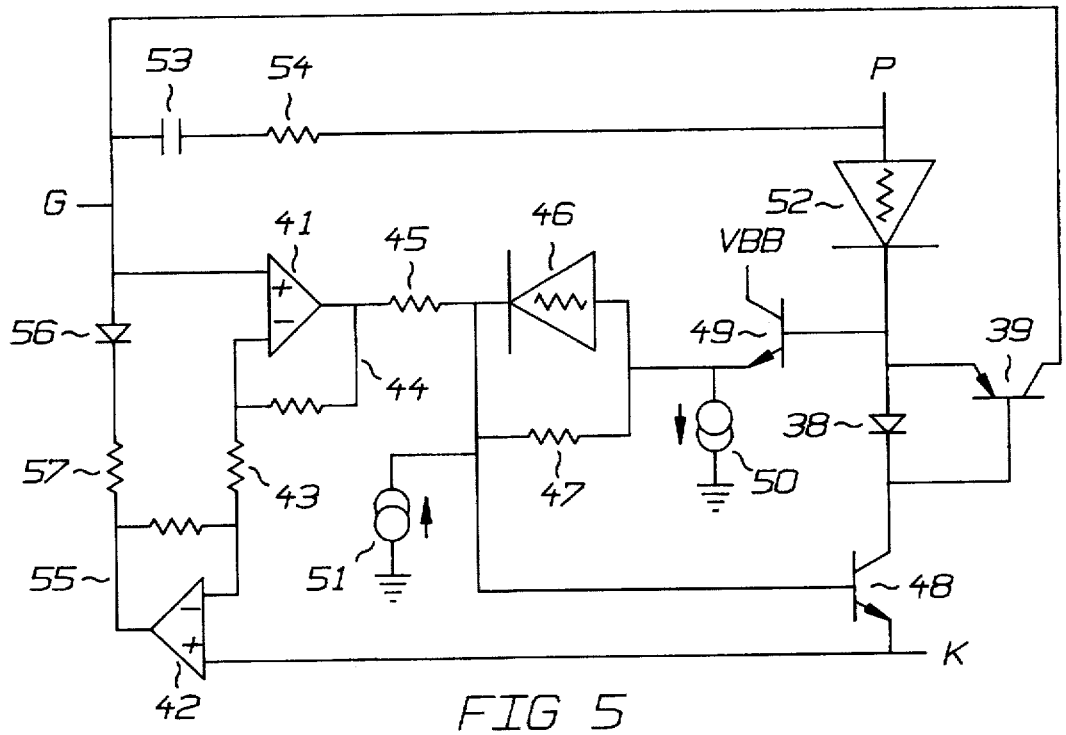
FIGS. 5 and 7 are schematics of triode emulation circuits.

The object of this invention is the interconnection of the various tube emulators and control circuitry to form complete amplifiers. The control circuitry provides a selection means for selecting one of a plurality of preamplifiers and for selecting output parameters.

An object of this invention is the means for the emulation of grid current with scaled diode conduction.

Another object of this invention is the improvement of the diode-transistor non-linear means. In particular, the inclusion of resistor means for the stabilization of parameters.

Another object of this invention is the means for the emulation of current gain in vacuum tubes as particularly found in cathode followers and other high impedance cathode load situations.

Another object of this invention is the triode tube emulator for large cathode impedances as exhibited by cathode followers and cathodyne phase splitters.

Still another object of this invention is the emulation of crossover distortion.

And another object of this invention is the emulation of compression using load sensing and filters or using a high resistance/temperature coefficient device such as a lamp filament.

Other objects, advantages, and novel features of the present invention will become apparent from the following detailed description of the invention when considered in conjunction with the accompanying drawings.

The complete amplifier means will be much easier to understand once the various components are disclosed.

THE NON-LINEAR NETWORKS

The resistor-diode network of FIG. 1 is described in U.S. patent application Ser. No. 07/466,865, U.S. Pat. No. 5,133,014 issued Jul. 21, 1992. It is a plurality of parallel resistors 1–5 series diodes 11–14. For input voltages across terminals A and B of less than one diode drop, only resistor 1 conducts. For input voltages between one and two diode drops, resistors 1 and 2 conduct. Higher voltages make more resistors conduct, thereby lowering the dynamic resistance of the network.

The resistor-diode network of FIG. 2 has a plurality of parallel resistor and diode pairs in series. As the current flowing from terminal A to B increases, the voltage across the resistors increases. When the resistor voltage approaches the diode drop, the diode conducts and dynamically removes the resistor from the series string. When all of the diodes conduct, the resistance of the network is the resistance of resistor 25.

The networks of FIGS. 1 and 2 consist of a plurality of series diodes and a plurality of resistors connected to the diodes so that the diodes include or exclude resistors as a function of the voltage across the series connected diodes.

There is a rough equivalency between these networks: Equal resistors in FIG. 1 produces a current approximately proportional to the square of the voltage across the terminals. Similarly, if the resistors of FIG. 2 are in the ratios of 1, 1/3, 1/6, 1/10, 1/15 ... and the last resistor, the nth, is 2/n, then it too produces a current approximately proportional to the square of the voltage across the terminals A and B.

It should be noted that the networks approximate the desired function over a region. The diodes tend to sectionalize the function and eventually, when all of the diodes are on, the network becomes linear.

FIG. 3 also produces a squared current using semiconductor behavior found in logarithm amplifiers. The voltage across the terminals A and B is converted to a current by resistor 31. This current produces a voltage on the base of transistor 34 proportional to twice the logarithm of the current. The transistor 34 converts that voltage to a current in an exponential manner proportional to the square of the current through resistor 31 or the voltage across the terminals A, B. This is made possible by biasing diode 35 with current source 36.

IMPROVED DIODE-TRANSISTOR NETWORKS

FIG. 3A is an improved version of FIG. 3. The voltage across terminals A and B is converted to a current by resistor 131. This current produces a voltage on the base of transistor 134 proportional to twice the logarithm of the current. The transistor 134 converts that voltage to a current in an exponential manner proportional to the square of the current through resistor 131 or the voltage across the terminals A and B. This is made possible by using diodes 132 and 133 which conduct at low voltages, such as germanium or Schottky diodes. Both the germanium and Schottky diodes have a much higher leakage current than the silicon transistor base-emitter junction and consequently a much lower conduction voltage and consequently eliminates the need for the transistor biasing means 35 and 36.

The circuit of FIG. 3 is improved by using transistor 137 to substantially isolate the current from A to B from the current in resistor 131. The circuit is further improved by resistors 138 and 139 and capacitor 140. This network stabilizes the non-linear behavior of FIG. 3A. The resistors 138 and 139 are equal and relatively small, about 100 or 200 ohms. An initial concept is to make the capacitor large so that it represents a short at all frequencies of interest. Smaller capacitors correspond to vacuum tubes with incomplete bypassing. Just as the incompletely bypassed cathode resistor produces a large plate resistance at low frequencies, a small capacitor also produces a resistance from A to B at low frequencies. Yet this improved version of FIG. 3 still shares the basic concept, the voltage between terminals A and B is converted to a current which becomes a diode voltage across diodes 132 and 133 which drives the transistor base to create a current form A to B which is non-linearly related to the voltage from A to B.

FIG. 3B is similar to FIG. 3A with the exception that the stabilizing resistor means 138-139 of FIG. 3A is reduced to a single resistor 239. This is done by using standard signal diodes 232-233 instead of Schottkys 132-133. The capacitor serves the same function and is sized the same way. However, the value of resistor 239 is approximately a diode conduction voltage divided by the desired nominal network current.

For brevity in the drawings, a new symbol shown in FIG. 4 will indicate a non-linear network as shown in FIGS. 1, 2, 3, 3A, or 3B.

A TRIODE

The circuit of FIG. 5 approximates a triode. The terminals G, K, and P represent the grid, cathode, and plate respectively. The grid-to-cathode voltage is transferred by amplifiers 41 and 42 to resistor 43. The voltages at outputs 44 and 55 of amplifier 41 and 42 respectively are then proportional to the grid-to-cathode voltage. The components 45-49 form a non-linear inverting amplifier with input resistor 45 and feedback created by resistor 47 and network 46. Transistor 48 is the amplifier and transistor 49 isolates the feedback from the output circuit. The gain from the gain G to the collector of 48 approximates the mu of the triode. Network 52 approximates the plate resistance, capacitor 53 is the plate-to-grid "Miller" capacitance while resistor 54 is a stabilizing resistor. The voltage at 55 scales the non-linear characteristics of diode 56 and resistor 57 to the grid-to-cathode diode characteristics, approximately. By proportioning the gains of amplifiers 41 and 42 to the resistances 45 and 57, any current flowing in diode 56 will produce an equal current into the cathode terminal K.

Notice that the amplifiers 41 and 42 are made linear by the feedback resistors and that the output of the amplifier 44 is connected to the plate terminal by a non-linear means 46-52.

The optional diode 38 and transistor 39 sense the plate current and feedback a small portion to the grid G, about 0.1 percent, to simulate the negative grid current. This feedback is only important for extremely high input impedance amplifiers, such as capacitor microphone preamplifiers.

The scaling of the grid-to-cathode voltage by amplifier 42, diode 56, and resistor 57 is necessary for emulating high gain vacuum tubes with amplifiers operating with limited voltage swings.

Figure 6:
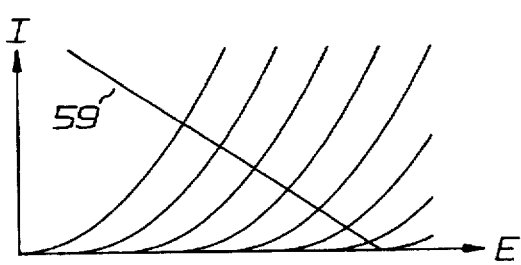
FIG. 6 is a graph of the output characteristics of the circuit of FIG. 5 or 7.

The resulting output characteristics are shown in FIG. 6. Although the curves are not precisely like tube characteristics, they are very close to the same around load line 59. This is further evidenced by similar distortions characteristics and intermodulation spectra.

The output characteristics of FIG. 6 show the upward sweeping shape of a vacuum triode and do not show the current limiting characteristics of pentodes.

The networks 46 and 52 preferably produce currents proportional to the square of the voltages across them so the circuit produces second harmonics. Squaring networks as described above are not perfect and produce a desired amount of third harmonics also.

Figure 7:
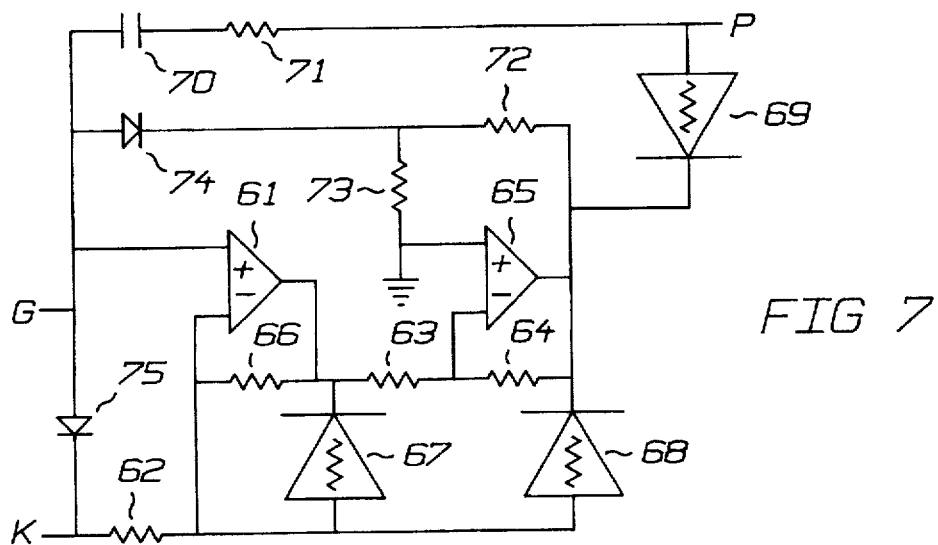

FIG. 7 illustrates another embodiment of a triode emulation circuit which makes the approximation that the plate current does not need to go through the cathode. Amplifier 61 transfers the grid-to-cathode voltage across resistor 62 and with resistor 63 is a non-inverting amplifier. Resistors 63 and 64 with amplifier 65 form a unity gain inverting amplifier. When the grid-to-cathode voltage is negative, resistor 66 and network 67 form the feedback for amplifier 61. When this voltage is positive, resistor 66 and network 68 forms the feedback under the control of amplifier 65. Network 69 forms the plate resistance. Capacitor 79 is the grid-to-plate "Miller" capacitance while resistor 71 stabilizes the circuit. Resistors 72 and 73 scale the conduction voltage of diode 74 to the desired grid-to-cathode conduction voltage. Alternately, the network 72-74 may be replaced by a diode 75 which may be a Schottky diode.

The circuit of FIG. 7 is biased differently than the circuit of FIG. 5 and produces plate voltages below the cathode voltage. But, the capacitive coupling to the next stage or the rebiasing of the next stage adjusts for the difference. The operation along the load line is similar since the intermodulation spectra is virtually identical over a 70 db range. This was done with all of the networks having second order characteristics of squaring to produce second harmonics.

The networks 46, 67, and 68 provide harmonics without clipping. The networks 52 and 69 also provide harmonics without clipping and control the harmonic generation when going into cutoff. Diodes 56, 74, and 75 control the bottom of the waveform shape and consequently the harmonic generation.

LOW-COST TRIODE TUBE EMULATORS

FIG. 7A is the schematic of a low-cost triode tube emulator. This circuit emulates the two most important features of triodes, the grid conduction and the plate characteristic. Most notably, this emulator has a linear amplifier 143-145 to produce a constant voltage gain, mu. This is not like vacuum tubes which have somewhat variable voltage gain, however, it a good approximation for a very popular vacuum triode, the 12AX7. The resulting plate current and voltage characteristics created by non-linear network 146 have plate curves that are equally spaced in voltage.

The resistor-diode network 142 and 141 from the grid terminal G to the cathode terminal K emulates the grid-tocathode conduction. The amplifier 143 with feedback resistor network 144 and 145 forms a linear amplifier which emulates the voltage gain, mu. While the network 146 emulates the plate resistance.

FIG. 7B is similar to FIG. 7A except for that the polarity of the non-linear components 241 and 246 are reversed from the polarity of 141 and 146. Diode means 141 conducts for negative grid voltages while 241 conducts for positive grid voltages. Non-linear means 146 conducts for more positive plate voltages while 246 conducts for more negative plate voltages.

Amplifiers using this concept must alternate stages of FIG. 7B with stages of FIG. 7A so that the non-linear effects alternately affect opposite sides of a waveform. FIG. 7A has the grid conduction effects on the negative side while the cutoff effects are on the positive side. Conversely, FIG. 7B has the grid conduction effects on the positive side and the cutoff effects are on the negative side. Tubes have both effects on the positive side but also inverts the signal which these circuits do not do. Thus, when one tube drives another, the cutoff effect of the driving tube is the same direction as the grid conduction effect of the driven tube. To keep this characteristic with these tube emulators, the stages must be alternated.

Consider further that the circuit of 7A is coupled to the circuit of 7B with a capacitor 147 to form a two-stage amplifier. The plate terminal of FIG. 7A has plate load resistor 148 connected to a positive supply. The grid terminal of FIG. 7B has a grid resistor 149 and the plate terminal has a plate load resistor 248 connected to a negative supply. The non-linear means of the first stage shunts current away from the grid emulation means of the second stage. Further the grid conduction means of each stage 141-142, 241-242 limits the amplified signal in the direction that causes the associated non-linear means 146, 246 to conduct.

The polarity reversal needed to create non-linear device 246, as illustrated in FIGS. 3A or 3B, is replacing NPN transistors 134, 137, 234, or 237 reversing diodes 132, 133, 232, and 233, and providing transistor 137 and 237 with a negative supply.

The low-cost emulator preferably uses non-linear networks of FIGS. 3 or, preferably, 3A or 3B. The advantage of 3A or 3B is that its capacitor can be sized to simulate the partially bypassed cathode resistor. The partially bypassed cathode resistor not only affects the frequency response; it alters the effective plate resistance. The plate resistance at very low frequencies is higher by an additive factor of the product of the voltage gain, mu, and the cathode resistor, Rk. The operational arts certainly have the capability to replace resistors 145 or 245 by a network for shaping the frequency character in a manner of the cathode resistor. This, however, has an insignificant effect on the output impedance of circuits 7A or 7B. An examination of FIG. 3A shows that at very low frequencies capacitor 140 is not effective and the circuit appears to be a current mirror having a high output impedance. At high frequencies this circuit has the non-linear character of FIG. 3. Sizing this capacitor controls the frequency range of the transition from high impedance to a more non-linear character. In FIG. 3B, frequencies where the capacitor is not effective will produce a nearly constant current source.

EMULATION OF CURRENT GAIN

The vacuum tube grid-to-cathode diode exhibits some resistance at significant grid currents and consequently represents a grid voltage which is amplified by the voltage gain, mu, and then converted to a current by the plate resistance, rp. Another way of looking at this behavior is that the grid current produces a grid voltage which becomes a plate current by the transconductance, gm, (gm=mu/rp) of the tube or in this case the tube emulator. In either case, the ratio of the plate current to the grid current might be considered a current gain which is about 2 or 3 and generally less than 5. Such resistance is formed by the junction means of diode 56 and resistor 57 of FIG. 5, of diode 141 and resistor 142 of FIG. 7A, or of diode 241 and resistor 242 of FIG. 7B. This current gain affects the character of the more negative extremes of distorted waveforms on the plate terminals of FIGS. 5 or 7A or the more positive extremes of distorted waveforms on the plate terminal of FIG. 7B.

The output of the emulators are connected to the plate terminal by a non-linear network which emulate the plate resistance of a triode vacuum tube. The plate resistance is a significant factor in the behavior of circuits surrounding triode tubes. On the other hand, operational amplifiers have an nearly insignificant output resistance which is made quite irrelevant by the ubiquitous feedback.

THE CATHODE FOLLOWER EMULATOR

The circuit of FIG. 8 is a cathode follower emulator with transistor 82 providing gain and optional diode 83 assuring reverse current does not flow. Resistor 81 is proportional to the zero grid voltage plate resistance while resistor 84 is proportional to the inverse of the transconductance.

FIG. 9 is the approximate output characteristic of cathode followers and the circuit of FIG. 8. Line 88 represents the normal operation of the cathode follower. However, when the current becomes excessive, the grid voltage goes positive and conducts heavily. This is emulated by transistor 82 saturating and the base conducting heavily as line 89 shows. These characteristics belie the name of follower, since the circuit produces the same voltage out if it is able, otherwise produces no current or loads the previous stage.

The circuit of FIG. 8A is a vacuum triode emulator suitable for emulating cathode followers with transistors 182 and 192 providing gain and optional diode 183 assuring reverse current does not flow. Resistor 181 is proportional to the zero grid voltage plate resistance, rp, while resistor 184 is proportional to the inverse of the transconductance, rp/mu. The resistor 194 controls the current in transistor 192 so that it is proportional to the current in resistor 184. The additional transistor 192 provides the current gain exhibited by the FIGS. 6, 8, and 9 and thereby controls the character of the waveform when the grid current is flowing; the clipping behavior created by the cathode follower is not so severe.

The proportionality factor for resistors 181 and 184 must also include the gain supplied by transistor 192. For example a gain of three means that resistors 181 and 184 are three times the respective values of resistors 81 and 84. Resistor 194 is sized so that the parallel combination of resistors 184 and 194 is equal to resistor 84.

When the current through transistors 182 and 192 becomes excessive, transistor 182 saturates and creates a substantial change in input current similar to and simulating grid current. At this point, since transistor 182 becomes saturated, the pair of transistors act like a current mirror.

The integrated circuit processes can produce FIG. 8B which is based upon a transistor 282 with plurality of collectors, in this case, two. Transistor 282 is formed with a large base region on a large emitter tub, then two collectors are formed on the base region. One collector is attached to the plate terminal directly while the other is connected via the resistor 281 to the plate terminal, P. The base is connected to the grid terminal, G, while the emitter is connected to the cathode terminal, K. The current splitting previously made more accurate by resistors 184 and 194 is done by the precision geometry of the collectors in the base-emitter structure.

The emulators of FIGS. 8A and 8B are improved versions of FIG. 8 to exhibit current gain when grid conduction is being emulated. Grid conduction occurs when the transistor 182 of FIG. 8A is saturated. At this point junction means formed by transistor 182 and resistor 184 combines with junction means formed by transistor 192 and resistor 194 to form a current mirror. The resistors 182 and 184 stabilize the respective junction means to form an accurate mirror but is not necessary in the integrated process, as depicted in FIG. 8B, because of the precision relationship between the halves of 282.

The output resistance of the collector of a transistor is so high that it is ignored in analyses and thereby is higher than significant.

THE PHASE SPLITTER

Figure 10:
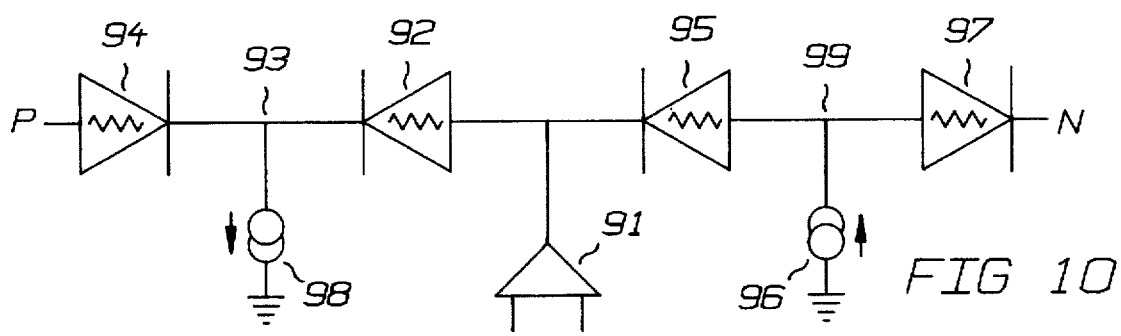
FIGS. 10 and 10A are the embodiments of a phase splitters.

FIG. 10 is an approximation to the phase splitter for a bipolar amplifier which requires both inputs in-phase. Since the two triodes in a differential amplifier phase splitter compensate each other, the stage produces very little distortion until clipping. The output resistance of the phase splitter is about twice the triode plate resistance normally, but becomes nearly infinite when clipping.

When the output of amplifier 91 goes high, network 92 pulls up voltage at 93. When the voltage at 93 approaches the plate voltage p, network 94 becomes more resistive and disconnects when the voltage at 93 is greater than the voltage at P. At the same time, network 95 disconnects and the current from source 96 flows through network 97 to plate N. Symmetric behavior occurs when the amplifier 91 output goes negative: network 92 disconnects, P has current from current source 98, network 95 pulls down voltage at 99, and network 97 disconnects from plate N.

The networks 94, 95, and 97 use an extra diode in series with the input to keep reverse currents from flowing. Network 92 does not emulate the low gain of the differential amplifier when the triode opposite the input is cut off. The circuit of FIG. 10 provides the soft cut off for the grid circuit of the output stage, such as the circuit of FIG. 11.

THE GENERALIZATION OF THE CATHODE FOLLOWER EMULATOR

The effective plate resistance, Re, exhibited by triode vacuum tubes having unbypassed cathode resistors, Rk, is very high: Re=rp+mu*Rk. When the cathode load resistance, Rk, is in the same magnitude as the plate resistance, rp, as usually the case for cathode followers and cathodyne phase splitters, then the effective plate resistance is dominated by Rk because the voltage gain, mu, is generally quite high, certainly greater than 10. The plate resistance of the tube, rp, and its non-linearities have little effect. As a consequence it is reasonable to use the high output resistance of semiconductors, transistors 82, 182, 192, and 282 in the emulation. The only time it is necessary to consider the plate resistance emulation with resistors 81 or 181 is in the simulation of grid current by the saturation of transistors 82, 182, or 282.

Figure 10A:
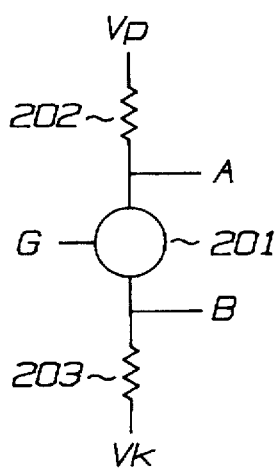

The high cathode resistance is not only found in cathode followers, but in the cathodyne phase splitter, FIG. 10A. This figure shows the emulators of FIG. 8, 8A, or 8B depicted as 201 in FIG. 10A. It is in the familiar phase splitter circuit with plate resistor 202 connected between the plate supply, Vp, and the plate terminal for supplying the inverted output and with cathode resistor 203 connected between the cathode supply, Vk, and the cathode terminal for supplying the non-inverted output.

Figure 11:
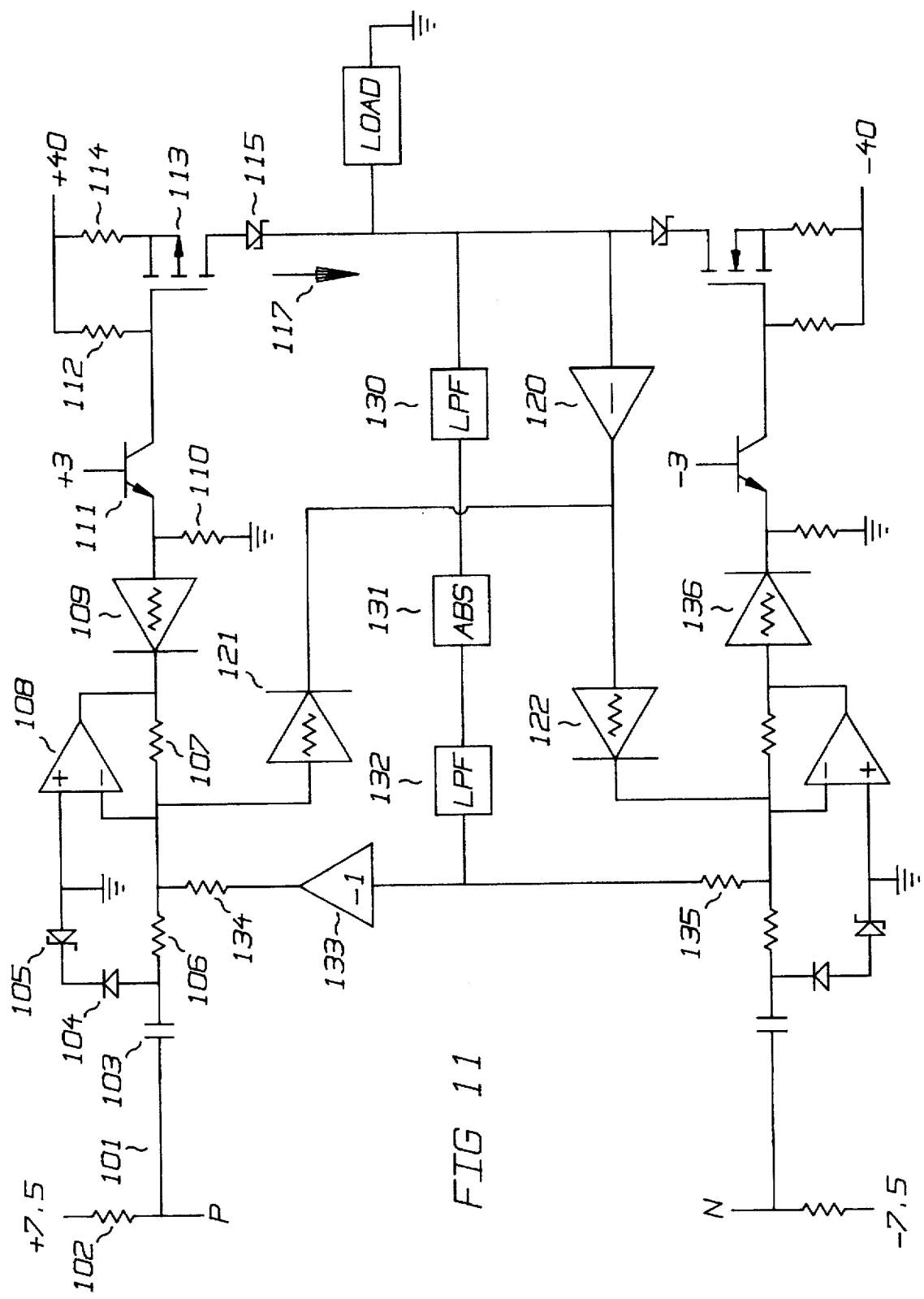
FIG. 11 is the embodiment of push-pull pentodes.

This phase splitter is used with an output circuit like that of FIG. 11 provided one input is inverted. The inversion of operational amplifier 108 or its symmetrical counterpart is quite within the operational amplifier arts.

PENTODE EMULATION

The circuit of FIG. 11 emulates push-pull pentodes. Since the negative half of the output stage operates symmetrically to the positive half, only the positive half will be detailed. Resistor 102 is the plate resistor for the input circuit, a phase splitter. Capacitor 103 is the coupling capacitor. Diodes 104 and 105 emulate positive grid conduction. Zener diode 105 adjusts for the nominal zero bias of this stage. Resistor 106 is the grid resistor which drives amplifier 108 with feedback resistor 107. Network 109 is nominally a squaring, second order emulation of the pentode transfer characteristic. This gain varying characteristic provides smooth crossover and the variable gain for emulating tube compression. Amplifier 111, shown as a transistor, shifts the level of the signal to the output supply voltage +40 with the help of resistor 112. MOSFET 113 with source resistor transfers the voltage on resistor 112 to a current through resistor 114. Bias resistor 110 is adjusted to overcome the threshold voltage of MOSFET 113. The remaining bias is established by the voltage on the base of transistor 111. Zener diode allows the load to fly back some before it is clamped.

The zener diodes, 105 and its symmetrical counterpart, form a voltage reference means and, excluding the bias on transistor 111 and the voltage offset of transistor 113, sets the maximum drive current produced by transistor 113.

The components 103–106 form a bias shifter as do their corresponding components of FIG. 1. The diodes correspond to the grid conduction of tubes 8 or 9. The capacitor 103 corresponds to their coupling capacitors. And resistor 106 corresponds to their grid resistors.

Figure 12:
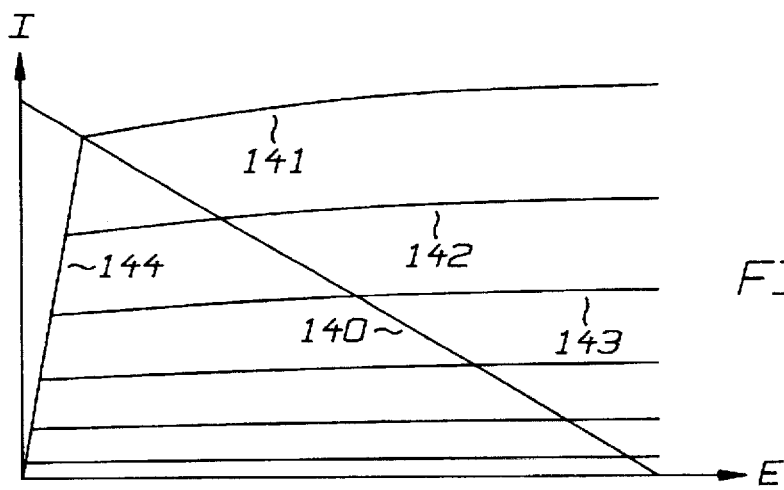
FIG. 12 is the graph of the output characteristics of pentode emulations including a load line.

Inverting amplifier 120 and non-linear networks 121 and 122 feedback the output to emulate the plate resistance of a pentode. Notice that the feedback loop goes through both non-linear networks. Consequently, the plate resistance and the transfer characteristics are functions of both the output and the input. This is seen in the different slopes of pentode plate curves 141–143 of FIG. 12.

The saturation region is emulated by resistor 114. Again, the entire characteristic is not perfect, but around the load line 140, it is a good approximation.

The poor regulation of the power supply coupled with screen grid operation creates the compression found in tube amplifiers. When the power supply sages under the load of large signals, the screen voltage goes down in a manner dictated by the power supply filter. The drop in screen voltage lowers the output current and lowers the gain of the tube.

The screen grid voltage shift can be lumped into a control grid shift according to Thomas Martin in his book *Electronic Circuits*, Prentice-Hall, pages 84–87 providing the signal is scaled appropriately.

Although the power supply could drive this circuit, it is simpler to estimate the power current with filter 130. The resulting signal is rectified by 131 and then filtered by 132 which has the same time constants and overshoot as the emulated power supply. The output of 132 is fed to the negative half by resistor 135 while being inverted by 133 and fed to the positive half by resistor 134. An increasing output then reduces the bias on networks 109 and 136, reduces the output currents, increases the resistance of these networks and lowers the gain. The compression control signal from the output of filter 132 is canceled in the output.

Figure 16:
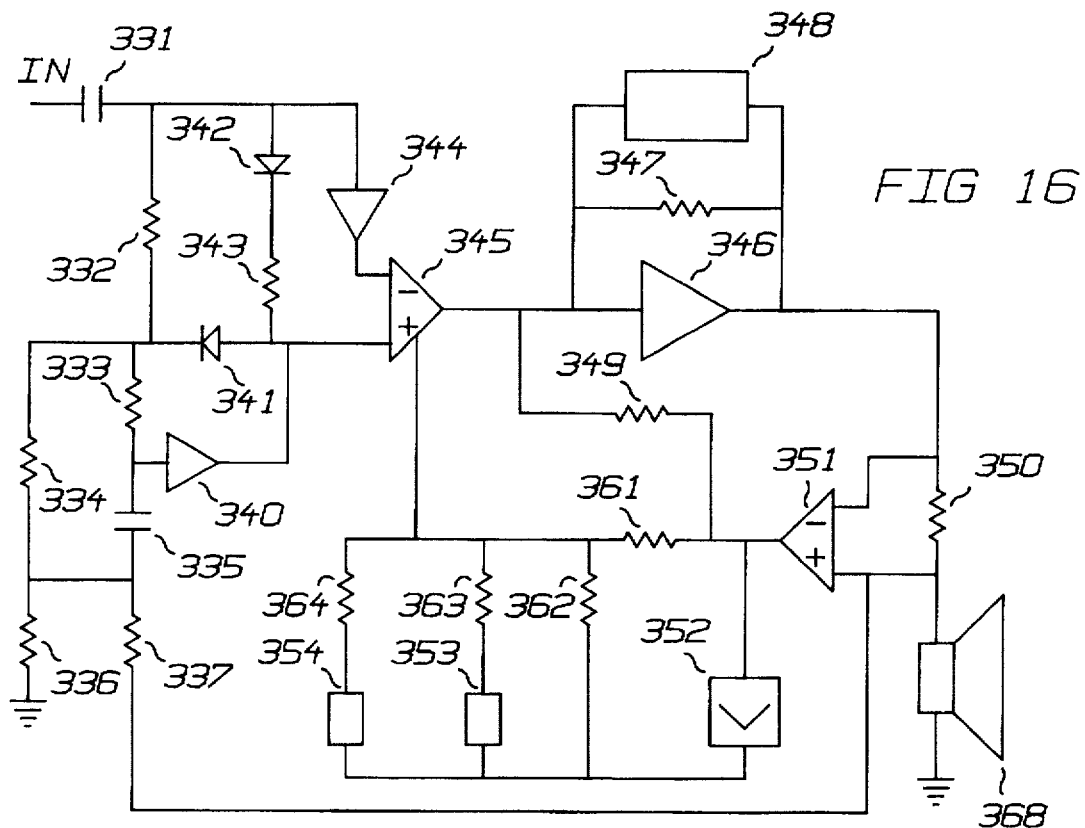
FIG. 16 is the schematic of another output stage.

This is similar to the behavior of tube compressor/expanders such as the expander, FIG. 16.10 found in *Radiotron Designers Handbook*, RCA Corporation, 1954.

The difference lies in the characteristics of the filter 132. Compressors react quickly to rising signals and slower to falling signals. But the power supply reacts similarly in both directions at a medium rate. The filters of compressors are non-linear single pole while the power supply is multipole and may have overshoot.

The input to filter 130 may be taken from the output in a feedback fashion or may be taken from an input for a feed forward operation.

Notice that with the appropriate choices of component values the circuit of FIG. 10 exhibits the four desired regions of operation. When the input signal is so large that it causes the grid conduction emulation diode 104 to conduct then the MOSFET 113 can source a limited current. If the load is a low impedance then MOSFET 113 does not saturate and it exhibits a high impedance as determined by the loop of 120, 121, and 107 through 115. If the load is a high impedance then MOSFET 113 does saturate and exhibits a low impedance as determined by its bulk resistance and resistor 114. When the grid conduction diodes are not being clipped, then the non-linear elements 109, 136, 121, and 122 introduce harmonics at high levels but leave the amplifier essentially without distortion at low levels.

Notice further that the output impedance of the pentode emulator varies from significant or sufficiently high that it can be ignored. In plate saturation the vacuum tube exhibits its saturation resistance about 200 ohms which is reduced by the output transformer to about 10% to 20% of the nominal output impedance, a significant amount. If not in plate saturation but in grid conduction the plate resistance of a 6L6 type vacuum tube of 10 to 40 thousand ohms which is then reduced by the output transformer to about 10 times the nominal output impedance, a significant or higher value. This value for an EL34 type vacuum tube with a very large knee in the plate characteristics varies from the saturation resistance of about 200 ohms to about 15 thousand ohms. The output transformer reduces this value to significant or higher. The circuit of FIG. 10 emulates both of these types and therefore has an output impedance which is significant or higher.

In addition to the triode configuration illustrated in FIGS. 5 and 7, a pentode emulation is achieved in FIG. 11. A control grid input would be on resistor 106, the screen grid input would be on resistor 134, the plate produces current through 114.

LAMP COMPRESSORS

The amplifier is an example of a controlled means, others include voltage controlled amplifiers and photo-resistive devices.

Figure 14:
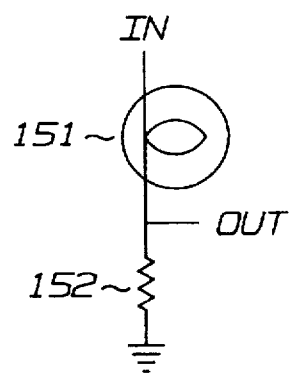
FIG. 14 is the embodiment of a lamp compressor.

FIG. 14 is an example of a lamp controlled compressor. The lamp 151 has a positive resistance change with temperature. A large signal on the input heats the lamp filament increasing its resistance and consequently the attenuation of the output as appears across resistor 152. The thermal characteristics of the lamp or other device with a high resistance temperature coefficient is a filter producing heat and the heat produces a resistance change which changes the ratio of input to output. By picking the right lamp or resistance temperature coefficient means properly, a good approximation to power supply response can be achieved. By picking the proper resistance, the proper compression of 1 or 2 dB can be easily achieved.

FIG. 14 is an example of a lamp controlled compressor. A large signal on the input heats the lamp filament. This increases its resistance and consequently the attenuation of the output as it appears across resistor 152. The thermal character of the lamp or other high resistance temperature coefficient device is a filter producing heat and the heat produces a resistance change which changes the ratio of input to output, or attenuation, i.e. compression.

By experimenting with lamps, since this behavior is not of interest to lamp manufacturers, one can find a lamp which has a time constant on the order of the response of the power supply of a vacuum tube amplifier. One can then pick a resistance for resistor 152 to achieve a compression of 1 or 2 dB.

Figure 15:
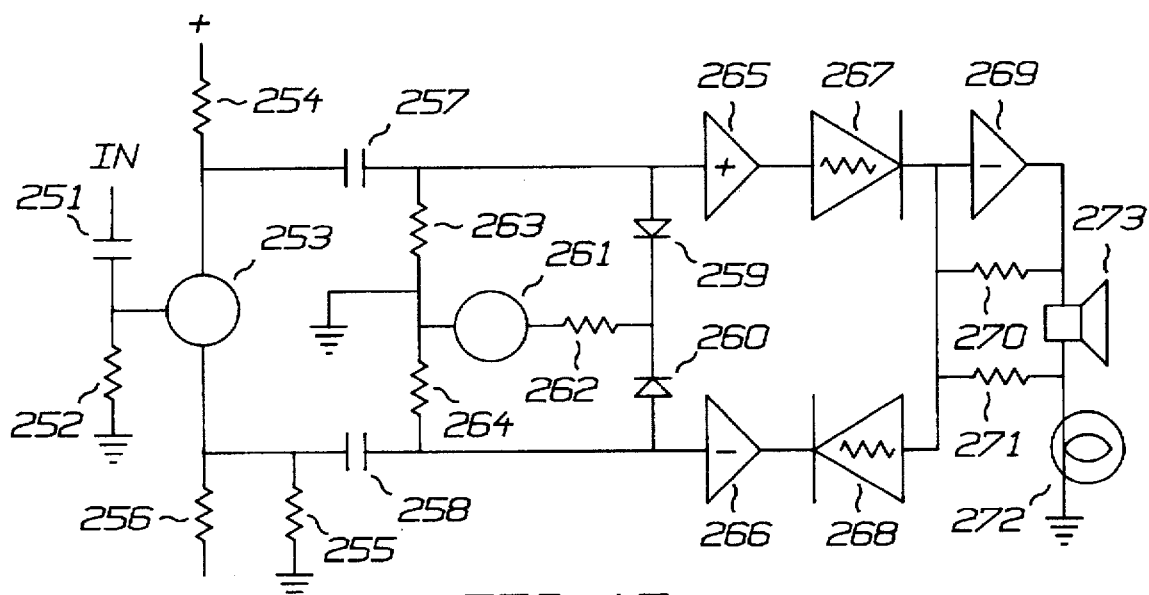
FIG. 15 is the embodiment of an amplifier using a lamp compressor.

FIG. 15 is an amplifier using the variability of the lamp resistance to compress. The input is coupled by capacitor 251 and biased by resistor 252. The phase splitter emulator 253 is like FIGS. 8, 8A, or 8B and has positive load resistor 254 and negative load resistors 255 and 256. The two phases are coupled by capacitors 257 and 258 to amplifiers 265 and 266. These amplifiers are biased by resistors 263 and 264. The grid conduction diodes are 259 and 260 which are connected to a voltage source or reference 261. The grid conduction diodes limit the amplifier signal to a limit. Optional resistor 262 softens the grid conduction or limiting character. The voltage source 261 alters the diode conduction characteristic so that the limit can be offset, like that of zener 105 in FIG. 11. Non-linear means 267 and 268, preferably one of the circuits illustrated in FIGS. 1, 2, 3, 3A, or 3B, drive the inverting amplifier 269. Its feedback has two forms: voltage via resistor 270 and current via resistor 271. The current feedback comes from lamp 272 which senses the speaker 273 load current.

Voltage source 261 may be fixed or may be variable so that the amplifier may match its speaker load better. Adjusting this voltage adjusts the conduction point of diodes 259 and 260 and consequently adjusts the maximum drive current of amplifier 269. Adjusting this current so that the amplifier does not clip for low impedances but does clip for high impedances keeps the amplifier from sounding so saturated as prior art solid state amplifiers and some tube amplifiers do. The adjustment of voltage source 261 corresponds to selecting voltages for zener diode 105 of FIG. 11. This maximum drive current adjustment alters the distortion character of the amplifier. This adjustment can also be done by altering the bias current in the transconductance amplifiers 345 of FIGS. 16 and 17. A "grounded" base transistor stage connected between the transconductance amplifier 345 and the resistors 361–364 with the emitter connected to the resistors and the collector to the amplifier. Changing the base voltage changes the maximum current and consequently the output capabilities 346, the maximum drive current of the amplifier, and consequently the distortion character of the amplifier.

Note that ordinary resistors are do not have high thermal resistance coefficients. Lamps on the other hand have a resistance which can produce large resistance changes between cold and hot.

This amplifier has the initial bias shifting created by the input capacitor 251 and the junction means of 253. It has the limiting of the phase splitter signals by diodes 259 and 260, which are similar to diode 104 and its symmetric diode of FIG. 11. The transconductance character is created by non-linear means 267 and 268 which are similar to 109 and 136. The lamp provides an approximation to the saturation resistance emulated by resistance 114.

The lamp resistance and consequently the gain varies with lamp temperature which is a function of the speaker current and time. When the speaker has a small current running through it, the current in the lamp is low and consequently the resistance is low and the gain of the amplifier 269–272 is high. When the current in the lamp is high, then its resistance is high and the gain is low. This circuit acts as a compressor. The time that it takes to compress is a function of the thermal mass of the lamp and its heat dissipation rate.

FIG. 15 further has approximate push-pull pentode characteristics since the lamp resistance is approximately the saturation resistance, the combination of voltage and current feedback produces a high resistance comparable to the plate resistance of a vacuum tube amplifier as reduced by the output transformer. The limiter provides the grid conduction signal limitation of the output tubes and the bias shifter produces the bias shifting of a phase splitter.

The amplifiers of both FIGS. 11 and 15 have the grid conduction current gain as evidenced by the grid conduction diodes 104, 259, and 260 and following amplifier means 106-113 and 263-272 which have a significant output impedance. These circuits have a grid at the point the grid conduction diodes connect, a plate at the output, and a cathode at a reference voltage.

COMPUTER OPERATION

Figure 13:
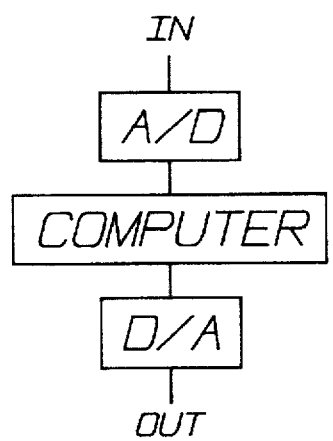
FIG. 13 is a digital embodiment.

Real-time computer emulation of tube circuits is possible since the mathematical quantities of operational amplifiers, resistors, capacitors, and non-linear networks are readily established. See my U.S. Pat. No. 4,995,084 which is incorporated herein by reference. FIG. 13 shows the input acquired by analog-to-digital converter and processed by computer for output by digital-to-analog converter.

ANOTHER OUTPUT STAGE

The first embodiment of the invention is shown in FIG. 16. The basic input circuit is simply copied with input coupling capacitor 331 and grid bias resistors 332 and 333. The resistor 334 corresponds to the cathode resistor of a differential phase splitter but must be made much larger since no tube current flows through this resistor. The feedback is applied through capacitor 335 and voltage divider resistors 336 and 337. Amplifier 340 is a unity gain connected operational amplifier. Diode 341 keeps the common cathode junction between resistors 332 and 333 from going too low. Diode 342 emulates grid conduction. Resistor 343 emulates the effective grid impedance. It is adjusted to provide the desired bias shifting and resulting harmonic generation. Unity gain buffers 340 and 344 prepare the resulting signal for the generally lower impedance transconductance amplifier 345, a CA3080 for example. This drives a power amplifier 346 with a bipolar current. This amplifier has a feedback resistor 347, non-linear network 348, and current feedback components 349 through 351 to produce the output character of push-pull pentodes. The current sense amplifier 351 provides current feedback via resistor 349 and drives an absolute value circuit 352 which in turn drives low pass filters 353 and 354.

The current sense amplifier gives the output amplifier a high output impedance although that may be lowered by the feedback via resistor 337. That feedback is reduced, however, when the transconductance amplifier 345 is driven to its limit which is approximately the bias flowing in resistors 361 through 364. Unlike the standard engineering concept, for normal loads, amplifier 346 does not saturate or clip prior to amplifier 345 reaching its limit. However, for light loads, such as at speaker resonance, amplifier 346 will clip prior to amplifier 345. This gives this circuit two clipped regions, a low impedance and a high impedance, depending upon which amplifier clips or limits.

The current sense amplifier allows the load, the speaker, to be grounded. If this is not required, a current sense resistor can be inserted in the speaker ground lead. In either case amplifier 346 and current sensing means 350 and 351 or resistor in the speaker ground lead form a current amplifier.

Notice that any current amplifier with the appropriate current and voltage can be substituted for amplifier 346 and current sensing means 350 and 351. A particularly attractive amplifier is class D, a switching amplifier. The switching amplifier is quite stable and works quite well when the predominate feedback is current.

The non-linear network 348 creates the emulation of the soft knee in the plate characteristics of some power tubes such as the EL34, the EL84, and the 6V6. It creates the character by reducing the gain at high output voltages which correspond to low plate voltages of the emulated tubes. This network is detailed below.

The filter 353 emulates the response of the power supply and produces a negative going output for an increasing magnitude of output current. The character of this filter is a resonant frequency of about 8 hertz with a Q of about 2.

The filter 354 emulates the power tube self bias and also produces a negative going output for an increasing magnitude of output current. The character of this filter is single pole with a time constant of 5 milliseconds.

The resistors 361 through 364 and the difference in nominal output levels of the components 351 through 354 and the bias input of transconductance amplifier 345 biases the transconductance amplifier. This bias sets the transconductance and the maximum magnitude of the output current of said transconductance amplifier. The current through resistor 361 creates even harmonics in the output because the gain is a function of the signal. The current through resistor 362 changes the gain of transconductance amplifier with the magnitude of the signal and creates odd harmonics in the output. This resistor needs to be sized to produce harmonic levels less than 1 percent at low levels and levels greater than one percent at high, but unclipped, levels. The current through resistor 363 creates the screen grid compression effect because the gain is a function of the emulated power supply response. The current through resistor 364 creates the cathode bias effects because the gain is a function of the emulated cathode bias.

Since the total current flow through resistors 361 through 364 determines the maximum current that can flow out of transconductance amplifier 345 and drive the following stage, these must be picked so that low impedance loads do not saturate amplifier 346 and higher impedance loads do saturate amplifier 346. This gives the amplifier its two clipping regions and a portion of the vintage tone.

Further, resistor 362 must be sized to produce the substantial third harmonic found in push-pull amplifiers. This is sized to produce a blending of non-clipped and clipped distortion so that the amplifier distorts over a wide range of inputs. This is the opposite of the usual engineering philosophy of pushing the distortion region up to the clipping point and then paying the price of instant and harsh audible complaints.

Obviously, filter 354 and resistor 364 may be omitted if cathode or self bias effects are not wanted. However, they do produce a pleasant chime effect.

The absolute value circuit 352 need not be precision. The requisite diodes may exhibit their voltage drops since the effects that this circuit drives and creates occur at large signal levels. This creates an essentially linear region which then becomes non-linear as the signals approach clipping and produces the other two regions of amplifier operation.

If the feedback is not used, such as in the emulation of the VOX AC30 amplifiers, resistor 337 is omitted and resistor 336 is reduced to zero.

THE MICROPOWER STAGE

Figure 17:
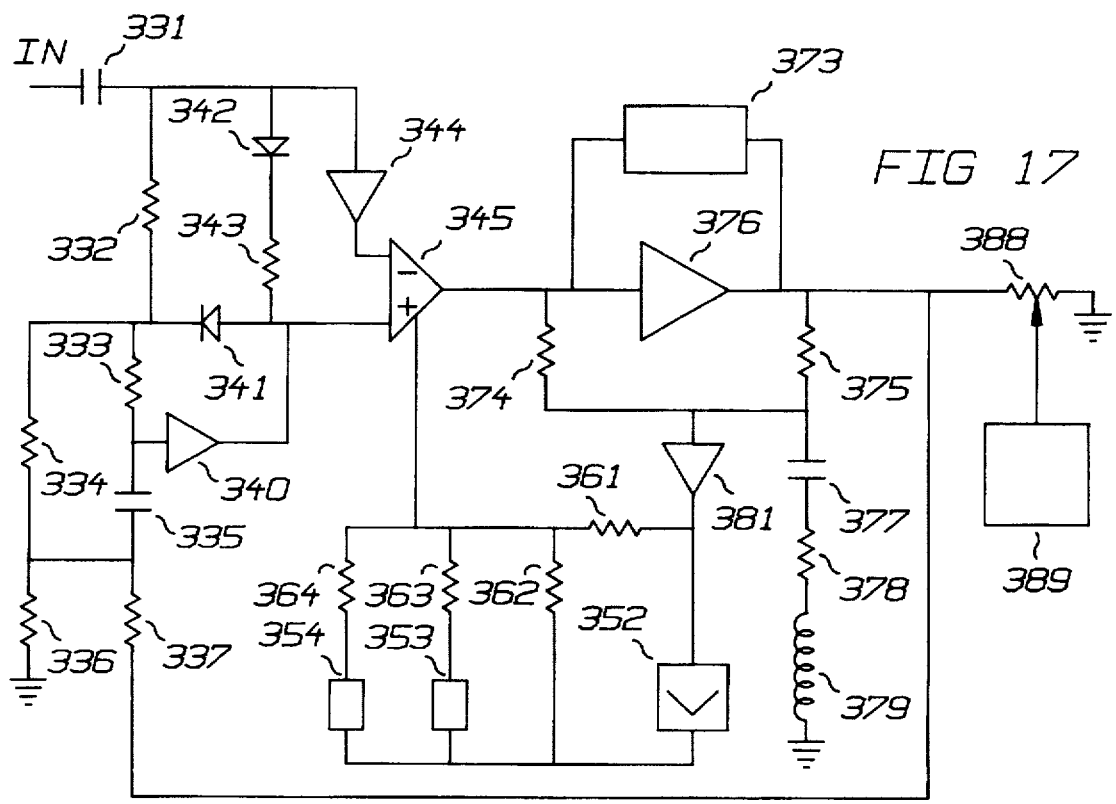
FIG. 17 is the schematic of a micropower stage.

The second embodiment, FIG. 17, of this concept lowers the power output and includes the major portion of the behavior of the speaker 368, its resonance, into the circuit. This circuit uses the same input components 331 through 337 and 340 through 345 although the feedback attenuation is reduced for the reduced output level. This circuit also biases the tranconductance amplifier in the same way with absolute value circuit 352, filters 353 and 354, and resistors 361 though 364. The second embodiment differs in the last stage which includes the speaker resonance in its character. The transconductance amplifier 345 drives inverting amplifier 376 with a bipolar current. This amplifier has a non-linear feedback 373 similar to 348 and performing the same basic function as 348 but operating over a reduced voltage range. The feedback resistor 347 is split in two portions 374 and 375. Their junction drives a capacitor, resistor, inductor network 377 through 379 respectively and drives the amplifier 81 to supply a signal indicative of the output load current to the transconductance amplifier biasing components 352 through 354 and 361 through 364.

The behavior of network 377 through 379 is the dual of the speaker character because it is located within the feedback loop of the 376. It is so located because the series resistor and inductor are readily simulated by an operational amplifier circuit. The standard parallel resonance could be used with a high output impedance amplifier.

By appropriate component selection, the second embodiment can also have four regions of operation. The unclipped regions stay the same as in the first embodiment, essentially linear and non-linear, but the clipped regions change from low and high impedance to low or bass and higher or middle frequencies. The low frequencies are clipped at a higher level than the middle frequencies.

The amplifier 376 drives the master volume control 388 which attenuates the signal for a later power amplifier and speaker or speaker emulator 389. The speaker emulator in this case need only replicate the bass resonance and treble roll-off from a signal transfer point of view and need not emulate the resonant load since that has already been done by the network 377 through 379 or its equivalent. The speaker emulator or the emulation of the output of a microphone placed near a speaker is disclosed in my U.S. Pat. No. 4,995,084 as direct equalization and are included herewith by reference.

CROSSOVER DISTORTION

Crossover distortion is the generally undesired perturbation created in the output waveform as a push-pull amplifier changes from one output device to another. But, crossover distortion has become an expected phenomenon. Referring to FIG. 11 it is possible when the signal through components 102–115 stop driving a current 116 and the symmetric side starts driving a current into the load and visa versa. A large signal in the phase splitter, FIG. 10, produces a large signal at points P and N in FIG. 11. A signal large enough to cause grid conduction as emulated by diodes 104–105 and their symmetrical counterparts offset the signals and cause the amplifier to shift from a normal class AB operation towards and into class C behavior. This behavior is part of the overdriven vacuum tube amplifier behavior. Not only is it simulated by FIG. 11, it is also simulated by FIG. 15.

FIG. 15 shows the phase splitter of FIG. 10A 253–256 driving amplifiers 265–266 and grid conduction emulation 259–262 via coupling capacitors 257–258. The same conditions occur in FIG. 15 as FIG. 11 except the connection point of the symmetric sides is at the input of amplifier 269 instead of at the load, as it is in FIG. 11.

FIGS. 16 and 17 create crossover distortion only to the extent that the signal in resistor 362 alters the gain in amplifier 345. This is also true of non-linear networks 109, 136 and 267, 268.

Figure 18:
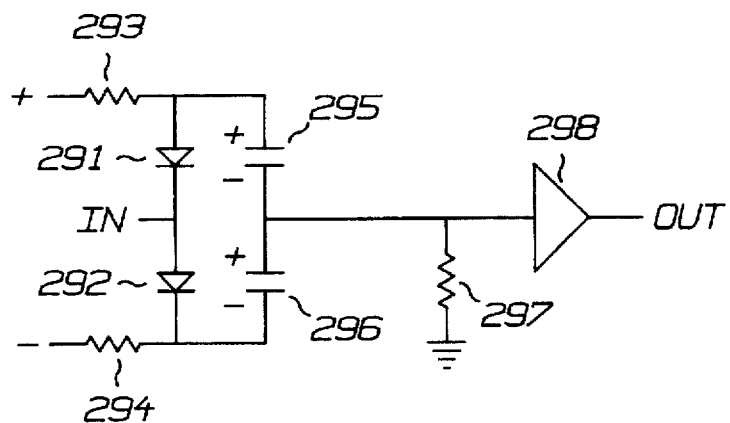
FIG. 18 is a schematic of a crossover distortion simulator.

FIG. 18 shows a crossover distortion simulator which produces a dead region between the positive portion and the negative portion of a signal for large signals, but not for small signals. The input passes through non-linear means 291–292 illustrated here as diodes biased by resistors 293–294. The two signals are capacitively coupled by capacitors 295–296 to resistor 297. The resulting signal is then amplified by amplifier 298. The capacitors are normally charged as shown it the input has no signal and is biased at ground. When the signal becomes large, the capacitors face a non-symmetric current flow. When the input signal is high then diode 292 conducts heavier than diode 291 and capacitor 296 charges in the opposite direction shown while capacitor 295 charges in the direction shown. When the input is low, then the situations reverse. However, the charging in the opposite direction exceeds the charging in the same direction so that the capacitors become charged to less than a diode drop each. When this happens the output signal acquires a dead zone, i.e. crossover distortion.

Amplifier 298 is representative of 269–272 of FIG. 15 or 345–368 of FIG. 16 both of which have compression means.

GUITAR AMPLIFIER SYSTEM

Figure 19:
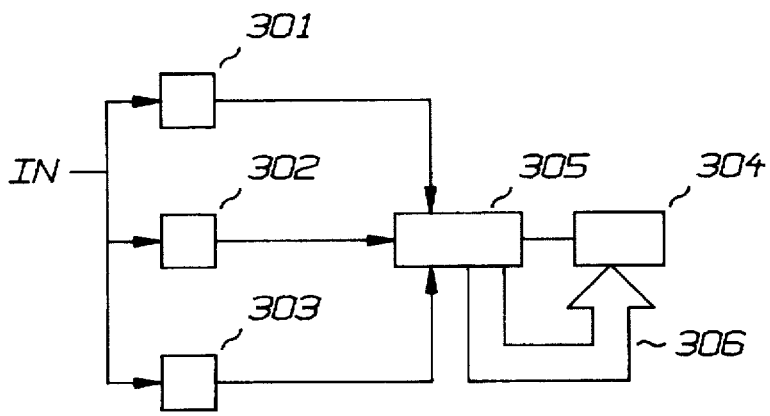
FIG. 19 is a block diagram of a guitar amplifier.

FIG. 19 is the structure of the amplifier system having a one or more preamplifier means 301–303 and an output means 304. Systems employing a plurality of preamplifier means requires channel switching means 305. Not only can the switching means 305 select a preamplifier, it can supply parameter selection information by control bus 306.

Figure 20:
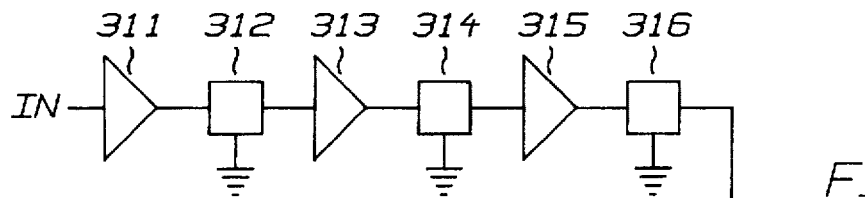
FIG. 20 is a block diagram of a preamplifier.

FIG. 20 is the structure of a preamplifier system having a plurality of stages 311, 313, and 315 coupled by 312, 314, and 316. These coupling means can either be a coupling capacitor, a filter, or a tone control means. The amplifier stages 311, 313, and 315 are triode emulation means such as FIGS. 5, 7, 7A, and 7B. These amplifier stages, particularly those driving tone controls, may also include cathode follower emulators 8, 8A, and 8B to buffer the output of the triode emulators.

FIG. 20 also shows a micropower stage 317, detailed in FIG. 16, and switching means 318 for including or excluding the micropower stage in the preamplifier.

The output means 304 has many options: It may include a phase splitter like that of FIG. 10 and an output stage like that of FIG. 11 which may also include a global feedback loop which includes both. Alternatively, FIG. 10A and FIG. 15 with an optional feedback around both may also be used for the output stage. Alternatively, FIG. 16 may be used.

Figure 21:
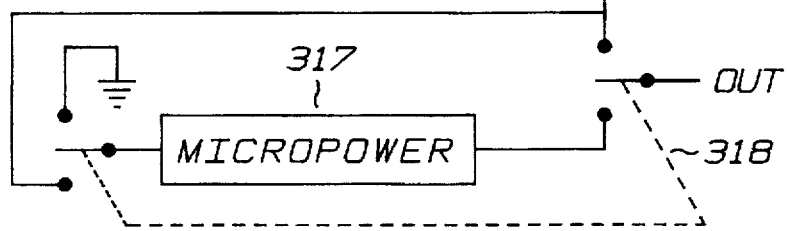
FIG. 21 is a block diagram of an output stage with parameter switching.
Figure 21:
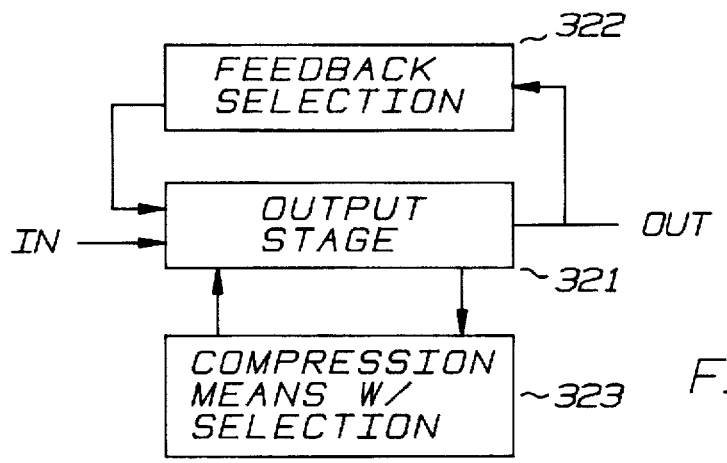

FIG. 21 shows an output stage 321 having feedback means 322. The feedback means for amplifiers is normally an attenuator, like resistors 336 and 337 in FIG. 16. The feedback means 322 includes a plurality of attenuators selected by a selection means in response to the selection means and selection bus 306. The compression means 324 includes a variety of filter means such as 354 and 353 that have outputs which may be turned on or off in response to said selection means and selection bus 306.

Figure 22:
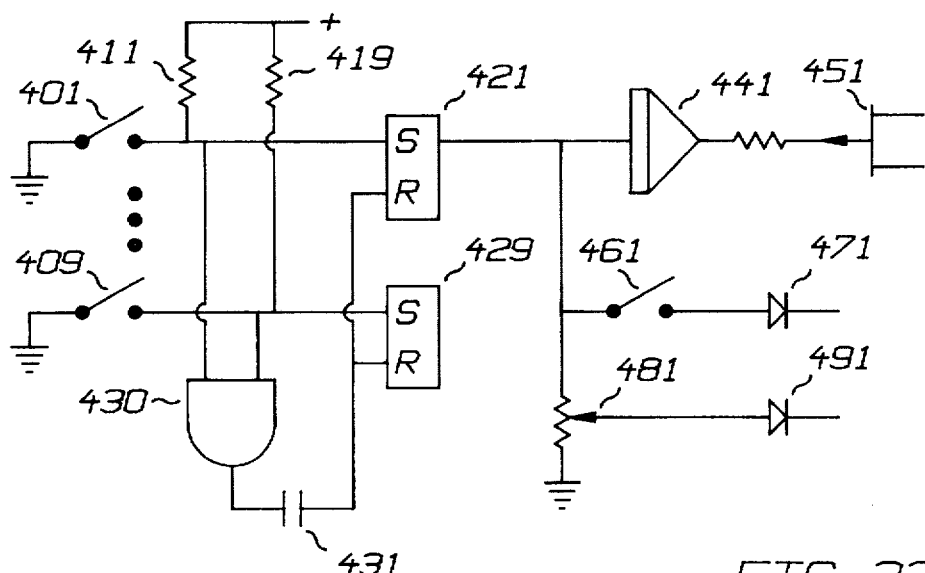
FIG. 22 is a block diagram of a switching network.

There are a number of selection means available in the digital arts. Certainly, one can use a switch to activate an input to a priority chip. This chip produces a binary output for the switch with the highest priority. The binary output is then latched for controlling analog switches in a variety of signal paths in the amplifier system. Alternatively, FIG. 22 shows a system of switches 401–409 and pull-up resistors 411–419 used to select a channel. These switches are used to set flip-flops 421–429 and to create a signal at the output of the OR gate 430 for producing a low signal if any of the input are low. This signal is then time limited by the capacitor 431 to momentarily reset all of the flip-flops. Thus, the previously set flip-flop is reset and the desired flip-flop is set. The output of all of the flip-flops drive switching arrangements like that shown for flip-flop 421. Integrator 441 provides a slow changing signal to the gate of field effect transistor 451. Note that this practical integrator has voltage limits and the output stops upon reaching these limits. Additionally, switches typical of 461 control signals through diodes 471. Additional analog control is provided via potentiometers typical of 481 and diodes 491. The corresponding diodes 471 and 491 for the various channels are tied together to form OR gates to the control of attributes of the power amplifier in response to the channel selection.

Notice that the output of the integrator or filter 441 is analog because it needs to transit between its minimum and maximum voltage sufficiently slow that capacitive coupling from the transistor gate will not be audible. Further, the output of the potentiometer 481 is also analog because the potentiometer adjusts, in this case, the maximum level. The potentiometer driven signals are useful for controlling Light Dependant Resistors which are then used for output stage presence control parameters, etc.

Although the present invention has been described and illustrated in detail, it is to be clearly understood that the same is by way of illustration and example only, and is not to be taken by way of limitation. The spirit and scope of the present invention are to be limited only by the terms of the appended claims.

I claim:

1. A solid state audio amplifier means for emulating a tube amplifier having a preamplifier means and output means for driving a load;
   wherein said preamplifier means includes tone control means; and
   wherein said output means includes means for emulating grid conduction and pentode output voltage and current characteristics.

2. The amplifier means of claim 1 which includes triode emulation means having plate, grid, and cathode terminals including a transistor means having a base connected to said grid terminal, an emitter connected to said cathode terminal, and a first collector connected to said plate terminal by a first resistor.

3. The amplifier means of claim 2 wherein said transistor means has a second collector connected to said plate terminal.

4. The amplifier means of claim 2 wherein said transistor means includes a second transistor having a base connected to said grid terminal, a collector connected to the plate terminal, and an emitter connected to said cathode by a second resistor and the emitter of the transistor means is connected to said cathode by a third resistor.

5. The amplifier means of claim 1 which includes resistance means having a large thermal resistance coefficient to produce a resistance which varies with signal strength and thereby alter the gain of said amplifier means.

6. The amplifier means of claim 1 which includes non-linear means for emulating the plate resistance.

7. The amplifier means of claim 1 which includes non-linear means for creating harmonics without clipping.

8. The amplifier means of claim 1 including non-linear means having first and second terminals comprising:
   first resistor means connected to said first terminal and diode means connected to said second terminal in series for converting the voltage between said terminals to a diode voltage; and
   first transistor having a base terminal connected to said diode means, an emitter terminal connected to said second terminal, and a collector terminal connected to said first terminal for converting said diode voltage to a current having a non-linear relationship between said terminals.

9. The amplifier means of claim 1 wherein said preamplifier includes grid emulation conduction means.

10. The amplifier means of claim 9 wherein said grid emulation means having a grid conduction characteristic has a grid terminal and includes amplifier means responsive to signals on said grid terminal and having an output; diode means having a conduction characteristic connected from said grid terminal to said output; wherein said amplifier scales said conduction characteristic to produce said grid conduction characteristic.

11. The amplifier means of claim 1 which includes a plurality of preamplifiers and a selection means for selecting a preamplifier wherein said selection means also selects at least one output stage parameter with at least one control signal so that said parameter may change with a change in preamplifier selection.

12. The amplifier means of claim 1 wherein said output means having an input terminal and comprising:
   an amplifier means;
   a first non-linear means and a first capacitor means connected in series between said input terminal and an amplifier means; and
   a second non-linear means and a second capacitor means connected in series between said input terminal and said amplifier means.

13. The amplifier means of claim 1 wherein said preamplifier means includes an emulator for a two-stage vacuum tube amplifier having an input and an output and comprising:
   a first amplifier responsive to said input and having a first amplifier output;
   a first non-linear means connected to the output of said first amplifier means and having a first plate terminal;
   a coupling capacitor means connecting said first plate terminal to a second grid terminal;
   grid conduction emulation means connected to said second grid terminal;
   a second amplifier responsive to said second grid terminal and having a second amplifier output;
   a second non-linear means connected between said second amplifier output and said output; wherein
   said first amplifier is non-inverting;
   said first non-linear means shunts current from said grid conduction emulation means; and
   said grid conduction means limits the signal in said second amplifier when said second non-linear means is conducting.

14. The amplifier means of claim 1 wherein said output means includes compression means.

15. The amplifier means of claim 14 wherein said output means includes sense means for sensing the current in said and load and providing a gain control signal for said compression means.

16. The amplifier means of claim 1 wherein said output means includes saturation resistance means.

17. The amplifier means of claim 1 wherein said output means includes means for adjusting the overdrive distortion character of the amplifier by adjusting the maximum output drive current.

18. The amplifier means of claim 17 wherein said output means include compression means.

19. A solid state amplifier having selection means comprising:
   a plurality of preamplifiers including tone control means;
   a preamplifier selection means including a bi-stable electronic memory means for selecting preamplifier signals and for producing at least one control signal responsive to said bi-stable electronic memory means; and a power output means for directly driving a speaker load and responsive to selected preamplifier signals, wherein said control signal controls at least one of the operating parameters of said output means.

20. The amplifier of claim 19 wherein the controlled operating parameter is the emulation of self biased output vacuum tubes.

21. The amplifier of claim 19 wherein said preamplifier selection means produces at least one analog control signal.

22. The amplifier of claim 19 wherein the at least one controlled operating parameter is the feedback within said output means.

23. The amplifier of claim 19 wherein said output means includes:

a variable gain amplifier responsive to said preamplifier selection means and responsive to a gain control signal;

an output amplifier means responsive to said variable gain amplifier; and gain control means for producing said gain control signal.

24. The amplifier of claim 19 wherein said preamplifier selection means produces digital control signals.

25. The amplifier of claim 19 wherein said preamplifier system includes a digital system having an analog-to-digital converter, a digital processor having memory, and a digital-to-analog converter.

26. The amplifier of claim 19 which includes resistance means having a large thermal resistance coefficient to produce a resistance which varies with signal strength and thereby alter the gain of said amplifier.

27. The amplifier of claim 11 wherein said at least one control signal controls the feedback within said output means.

28. The amplifier of claim 11 wherein said preamplifier selection means produces analog control signals.

29. The amplifier of claim 1 wherein said preamplifier system includes a digital system having an analog-to-digital converter, a digital processor having memory, and a digital-to-analog converter.

30. An audio amplifier having an input and an output comprising:

a preamplifier system responsive to said input for producing a preamplifier output and including a plurality of preamplifier stages, a tone control means, and switching means including a bi-stable electronic memory means for switching preamplifier signals and for producing at least one control signal responsive to said bi-stable electronic memory means; and a solid state power output means for driving a speaker load and responsive to said preamplifier output and said control signal for producing said output, wherein said at least one control signal controls at least one of the operating parameters of said output means.

31. The audio amplifier of claim 30 wherein the controlled operating parameter is the feedback of said output means.

32. The audio amplifier of claim 30 wherein the controlled operating parameters is the emulation of self biased output vacuum tubes.

33. The audio amplifier of claim 30 wherein said preamplifier system includes a plurality of preamplifiers, each preamplifier comprised of a plurality of coupled stages and having an output and said switching includes the selection of the preamplifier output.

34. The audio amplifier of claim 30 wherein said preamplifier system includes an emulator for an output stage.

35. The audio amplifier of claim 34 wherein said preamplifier system switching includes switching means for including or bypassing said output stage emulator.

36. The audio amplifier of claim 30 wherein said preamplifier system also includes a digital system having an analog-to-digital converter, a digital processor having memory, and a digital-to-analog converter.

37. The audio amplifier of claim 30 wherein said preamplifier selection means produces analog control signals.

38. The audio amplifier of claim 30 wherein said preamplifier selection means produces digital control signals.

39. The audio amplifier of claim 30 wherein said output means includes a phase splitter means having grid, cathode, and plate terminals comprising:

a transistor means having base, emitter, and first and second collector terminals; and a first resistor means; wherein said grid terminal is connected to said base terminal;

said cathode terminal is connected to said emitter terminal; said plate terminal is connected to said resistor means;

said first collector terminal is connected only to said resistor means; and said second collector terminal is connected to said plate terminal.

40. The amplifier means of claim 30 which includes resistance means having a large thermal resistance coefficient to produce a resistance which varies with signal strength and thereby alter the gain of said audio amplifier.

41. The amplifier means of claim 30 wherein said output means includes:

signal splitting non-linear means having first and second terminals for producing first and second signals;

a first capacitor coupling said first terminal to a first non-linear means and a first grid conduction means shunting said first non-linear means;

a second capacitor coupling said second terminal to a second non-linear means and a second grid conduction means shunting said second non-linear means; and amplifier means responsive to said first and second non-linear means for producing said output.

42. The audio amplifier of claim 30 wherein said output means includes a variable gain amplifier having a gain control input responsive to said preamplifier output and a gain control signal.

43. The audio amplifier of claim 30 wherein said operating parameters include the feedback of said output means and wherein said output means includes a gain control means for producing a gain control signal and variable gain amplifier which is responsive to said preamplifier output and said gain control signal.

44. A solid state audio amplifier for emulating a tube amplifier having a preamplifier means and output means wherein said output means comprises:

a non-linear amplifier responsive to said input and having a transfer characteristic which emulates the transfer characteristic of said vacuum tube amplifier;

an output amplifier means for providing an output signal in response to said non-linear amplifier and a load signal; and a load means for producing said load signal.

45. The amplifier means of claim 44 which includes resistance means having a large thermal resistance coefficient to produce a resistance which varies with signal strength and thereby alter the gain of said audio amplifier.

46. The solid state amplifier of claim 44 wherein non-linear amplifier includes said phase splitter comprising:

a transistor means having base, emitter, and first and second collector terminals; and a first resistor means; wherein said grid terminal is connected to said base terminal;

said cathode terminal is connected to said emitter terminal; said plate terminal is connected to said resistor means;

said first collector terminal is connected only to said resistor means; and said second collector terminal is connected to said plate terminal.

47. The solid state amplifier of claim 46 wherein said transistor means includes first and second transistors having first and second emitter, base, and collector terminals; wherein said grid terminal is connected to said first and second base terminals; and having second and third resistor means connected between said cathode terminal and said first and second emitters.

48. The solid state amplifier of claim 44 wherein said load means includes:

output signal current sense resistor means for sensing the output signal current and producing said load signal; and circuit means for producing a signal approximating the absolute value of said load signal; wherein said non-linear amplifier is responsive to said approximate absolute value of said load signal to produce said transfer characteristic.

49. The solid state amplifier of claim 44 wherein said load means includes:

filter means for filtering said approximating signal for producing a gain control signal and said non-linear amplifier is also responsive to said filtered approximate absolute value of said load signal.

50. The solid state amplifier of claim 44 wherein said load means includes:

filter means responsive to said output for producing said load signal; and circuit means for producing a signal approximating the absolute value of said load signal; wherein said non-linear amplifier is responsive to said approximate absolute value of said load signal to produce said transfer characteristic.

51. The solid state amplifier of claim 50 wherein said load means includes:

filter means for filtering said approximating signal for producing a gain control signal and said non-linear amplifier is also responsive to said filtered approximate absolute value of said load signal.

52. The solid state amplifier of claim 44 wherein said preamplifier means includes a plurality of preamplifier stages and a selection means for selecting preamplifier signals wherein said selection means also produces at least one control signal which controls an output stage operating parameter.

53. The solid state amplifier of claim 52 wherein said control signal controls the feedback within said output means.

54. The solid state amplifier of claim 44 wherein said preamplifier system also includes a digital system having an analog-to-digital converter, a digital processor having memory, and a digital-to-analog converter.

55. The solid state amplifier of claim 44 wherein said output amplifier is also responsive to non-linear feedback which is responsive to said output amplifier.

* * * * *